(12) United States Patent
Nordlinder et al.

(10) Patent No.: US 7,919,027 B2
(45) Date of Patent: Apr. 5, 2011

(54) METHODS AND DEVICES FOR MANUFACTURING OF ELECTRICAL COMPONENTS AND LAMINATED STRUCTURES

(75) Inventors: Staffan Nordlinder, Norrköping (SE); Fredrik Andersson, Hässelby (SE)

(73) Assignee: Webshape AB, Vallentuna (SE)

( * ) Notice: Subject to any disclaimer, the term of this patent is extended or adjusted under 35 U.S.C. 154(b) by 970 days.

(21) Appl. No.: 10/572,366

(22) PCT Filed: Sep. 16, 2004

(86) PCT No.: PCT/SE2004/001343
§ 371 (c)(1),
(2), (4) Date: Jan. 11, 2007

(87) PCT Pub. No.: WO2005/027599
PCT Pub. Date: Mar. 29, 2005

(65) Prior Publication Data
US 2007/0184743 A1    Aug. 9, 2007

(30) Foreign Application Priority Data

Sep. 17, 2003  (SE) ...................................... 0302467

(51) Int. Cl.
| | |
|---|---|
| B29C 67/20 | (2006.01) |
| B29C 37/02 | (2006.01) |
| B29C 65/00 | (2006.01) |
| H05K 1/00 | (2006.01) |
| B21D 13/00 | (2006.01) |

(52) U.S. Cl. ........ 264/175; 264/138; 264/167; 156/248; 156/270; 174/254; 72/186

(58) Field of Classification Search .................. 264/138, 264/167, 175; 156/248, 270; 72/186; 174/254
See application file for complete search history.

(56) References Cited

U.S. PATENT DOCUMENTS 4,020,548 A * 5/1977 Pohl ................................ 29/825
(Continued)

FOREIGN PATENT DOCUMENTS

EP          0375204          6/1990
(Continued)

OTHER PUBLICATIONS

Notice of Allowance dated Dec. 15, 2009 by the Japanese Patent Office for counterpart Japanese Application 2006-526857 (English Translation).

(Continued)

*Primary Examiner* — Monica A Huson
*Assistant Examiner* — Michael T Piery
(74) *Attorney, Agent, or Firm* — Harness, Dickey & Pierce, P.L.C.

(57) ABSTRACT

A method and device for manufacturing of electrical components on a continuous web or discrete sheets of dielectric material are disclosed. The method includes feeding, from a supply roll of a laminated web or a supply of sheets including at least one unbroken layer of conducting material laminated on a flexible backing layer of dielectrical material, the laminated web or discrete sheets to a nip between a patterned cylinder and a cooperating cylinder, to shape the conducting layer into a repeated pattern of conducting material having ridges and valleys. The method further includes removing, by mechanical machining, conducting material from the thus shaped conducting layer. The removing is performed simultaneously with the step to shape the conducting layer, and by way of the cooperating cylinder, designed as a milling cutter cylinder.

17 Claims, 7 Drawing Sheets

U.S. PATENT DOCUMENTS

| | | | |
|---|---|---|---|
| 5,528,001 A * | 6/1996 | Roberts | 174/268 |
| 6,083,837 A | 7/2000 | Millet | |
| 6,482,286 B1 * | 11/2002 | Harvey et al. | 156/244.27 |
| 6,543,130 B1 | 4/2003 | Wittmaier | |
| 7,101,437 B2 * | 9/2006 | Boutilier et al. | 118/211 |
| 7,225,688 B2 * | 6/2007 | Moore et al. | 73/862.55 |

FOREIGN PATENT DOCUMENTS

| | | |
|---|---|---|
| GB | 933385 | 8/1963 |
| JP | 3-150893 | 6/1991 |
| JP | 6-076659 | 3/1994 |
| JP | 06-140741 | 5/1994 |
| JP | 07-226574 | 8/1995 |
| JP | 10511606 | 11/1998 |
| JP | 11-186698 | 7/1999 |
| JP | 2001-111200 | 4/2001 |
| JP | 2001-257448 | 9/2001 |
| JP | 2003152310 | 9/2003 |
| SE | 320570 | 2/1970 |
| WO | WO 96/19912 | 6/1996 |

OTHER PUBLICATIONS

International Search Report (PCT/ISA/210).

Written Opinion (PCT/ISA/237).

International-Type Search Report (PCT/ISA/201/SE).

* cited by examiner

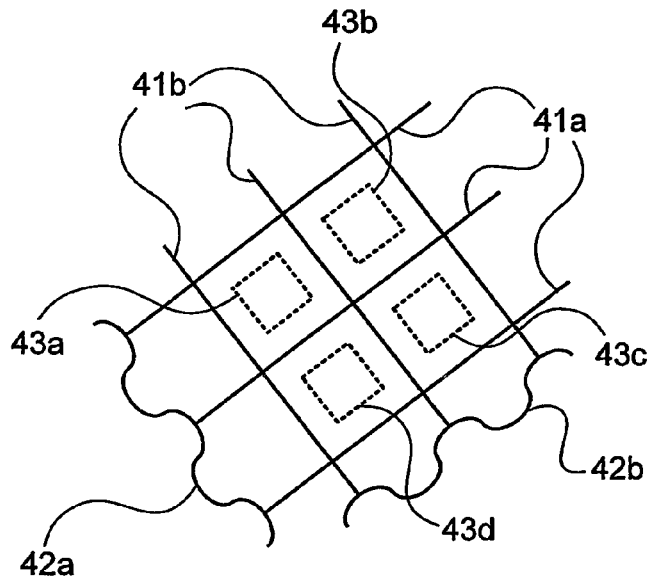
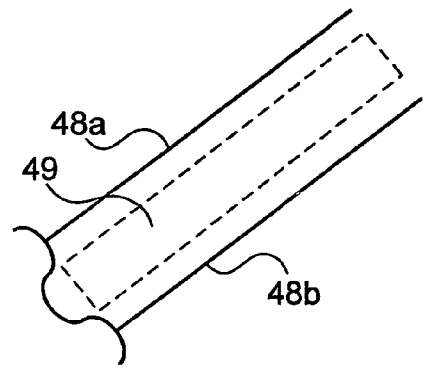
Fig. 9a
Fig. 9b
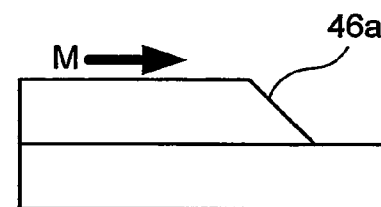
Fig. 10a
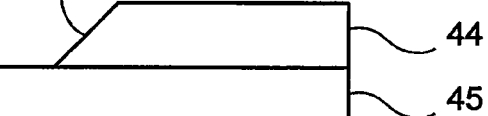
Fig. 10b
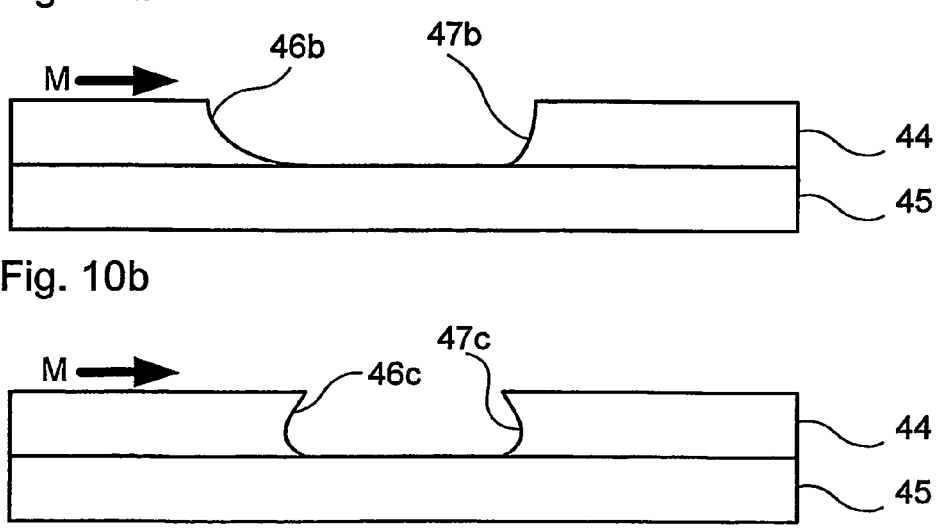
Fig. 10c (prior art)

METHODS AND DEVICES FOR MANUFACTURING OF ELECTRICAL COMPONENTS AND LAMINATED STRUCTURES

FIELD OF THE INVENTION

Present invention is directed to a method for manufacturing of electrical components on a continuous web of dielectric material or discrete sheets, including the step to feed, from a supply roll of a laminated web or a supply of sheets consisting of at least one layer of conducting material laminated on a flexible backing layer of dielectrical material, said laminated web or discrete sheets to a nip between a patterned cylinder and a cooperating cylinder to shape said conducting layer into a repeated pattern of conducting material having ridges and valleys, and the step to remove by mechanical machining conducting material from said thus shaped metal layer. It is also directed to a device for manufacturing of said electrical components.

More specifically, present invention concerns a method and a device for removing parts of one or more outer layer(-s) from a web or a sheet having a number of layers, at least one layer exhibiting good electrical conductivity and at least one layer is made of electrical insulating material or dielectric material. The method and device according to present invention is especially well suited for manufacturing of electrical conductors and components on a flexible backing, such as paper or plastic film.

In a more general perspective, the invention is directed to a method and a device for patterning a laminated sheet, to a cliché used in such a method and device, to a cliché blank for providing the cliché, to a laminated sheet patterned by such a method and device and to a printing system comprising such a device.

TECHNICAL BACKGROUND

It is previously known to manufacture electrical conductors and components on flexible backings or carriers by firstly apply a thin layer (<1 mm) of conducting material on the backing, e.g. metal or metal alloy or doped resin material, and secondly remove not wanted parts of said layer from the backing by etching with chemical substances. A drawback inherent in this kind of technique is that the process has to be done in a number of separate steps and thus it is only possible to perform this technique in a continuous process if the feeding rate of the web is low. An other problem is the possibility of unsufficient etching (when the process is isotropic). Further, the employed chemical substances give risk to waste management problems and high environmental loads.

Besides, it is previously known to remove thin layers from multilayered flexible material by milling, e.g. when perforating stamps. It is also known to measure the distance between two rolls forming a nip, through which a web of high resistivity is passed, by applying a voltage over the rolls. The measured resistance is decisive of said distance.

U.S. Pat. No. 6,083,837 illustrates a method and a device for uninterrupted manufacturing of electrical components. A metal sheet is passed through a nip between an embossing roller and an anvil deforming the metal sheet into a repeated pattern consisting of thick and thin regions. Downstream said nip a dielectric base material is applied to the thus deformed metal sheet and the assembly is fed to a process station where the thin metal regions are removed by etching, sputtering or abrading. Then the produced electrical components supported by said carrier of dielectric material are supplied to further process station. This known process requires a number of process stations and deforms rather than shapes the metal layer. Thus, the distance between the roll and the anvil is not critical and there is no means provided to adjust the size of nip. Further, the carrier material has to be flowable to adapt to the embossed metal layer.

SUMMARY OF THE INVENTION

It is an object of present invention to provide a method and device facilitating manufacturing of electrical components in a fast and reliable way using a single step.

It is an other object of present invention to manufacture electrical components on a continuous web or discrete sheets of an inexpensive and easy-to-handle material.

A further object of present invention is to manufacture electrical components on a continuous web allowing winding to a roll, facilitating storing and shipping and further processing of the electrical components.

These and other objects of present invention have been achieved by a method according to the first paragraph, characterized in that the step to remove conducting material from said conducting layer is performed simultaneously with the step to shape the conducting layer and by means of said cooperating cylinder designed as a milling cutter cylinder.

In this context, "simultaneously" means that the milling takes place while there is still sufficient support (such as by the ridges of the cliché) provided for the ridges created by the patterned cylinder. Hence, the actual forming of the ridges and valleys may take place slightly before the cutting operation, as long as there is still sufficient support for the ridges whose material is to be cut away, when the cutting takes place. For example, the shaping may begin at the moment the web or sheet sufficiently contacts the patterned cylinder, whereas a small period of time passes between such first contact and the cutting operation. During such time, the patterned cylinder may rotate so as to bring the web or sheet from the angular position of first contact (and start of the shaping operation) to the angular position where the cutting is effected. According to another aspect of the invention, what is referred to as a conducting layer above may be any type of functional layer.

The term "functional layer" is intended to comprise layers having a technical function, different than that of the backing layer, such as providing adhesiveness, swelling or shape altering properties (i.e. materials comprising blowing agents, memory alloys or similar), thermal expansion or shrinking properties, biocompatible properties, electrical or optical conductivity, semi-conductivity, semi-metallic materials, dielectric materials, alteration in surface energy (wettability) etc.

A device to perform said method according to present invention is characterized in that said rotating anvil is configurated as a milling cutter cylinder to remove conducting material from said metal layer simultaneously as the conducting layer is forced against the patterned cylinder to shape said repeated pattern.

The invention is defined in the appended independent claims.

Embodiments of the invention are set forth in the subclaims, in the following description and in the drawings.

Present invention is based on the recognition that it is possible to remove material, and in particular conducting material, from a web or discrete sheets by milling instead of etching when manufacturing electrical components on a coated flexible carrier substrate. The coated substrate is passed through a nip between two rotating rolls or cylinders. One of the rolls is equipped with milling elements or the like and the other roll is a kind of cliché roll or die cylinder having a pattern engraved into its envelope surface. The regions in which the conducting or metal layer is to be removed are present in the envelope surface and the regions in which the conducting layer are to be retained, completely or partly, are the engraved or recessed areas of the cliché roll. When passing through the nip the web or the discrete sheets is (are) forced against the cliché roll by applying a tensile stress on the running web or the discrete sheets and the relevant parts of the conducting layer are removed by milling without perforating the carrier substrate. However, it is possible to partly or totally perforate the carrier substrate, if needed.

A condition for making above stated method work is that is it possible to precisely enough measure how much material that is removed from the coating by the milling elements, i.e. the distance between the tips of the milling elements and the envelope surface of the cliché roll or patterned cylinder. A way to decide this is to isolate every machine part that will contact said conducting layer or carrier substrate and measure the resistance of the carrier substrate. From the rate of the resistance it is possible to determine the thickness of the layer. Due to the high resistivity of the carrier substrate the modification of the layer thickness (i.e. how much material that is removed) will be hard to measure by this technique. Further, the measurements are influenced by external conditions like air humidity, metal debris etc.

Alternately, said measurements may be conducted indirectly, at a position along the travel path just downstream said nip. A condition therefore is that one or more reference rings are embossed, etched or engraved in the envelope surface of the cliché roll, preferably outside the useful patterning region. However, it is also possible to arrange one or more of said rings somewhere between the ends of the cliché roll provided that they do not interfere with the electrical components to be produced. According to one embodiment two rings are provided at each end of the roll, one having a radius $r_1$ and the other a radius $r_2$ while the envelope surface of said roll has a radius $r_e$, where $r_e \geq r_1 > r_2$. Sensor means using per se known reading technique by means of photo-electric tubes or photo cells, e.g., are arranged along the travel path of the web, just downstream the nip, detecting the tracks in the conducting layer made by said rings in cooperation with the milling elements. Preferably, the radii of the reference rings are chosen such that only the track relating to the first ring will appear if said distance is correct. If the distance is too large there will be no track from the first ring and if the distance is to small the track from the second ring will appear too.

An advantage of the above method, as compared to etching techniques, is that the substrate (i.e. the web or sheet) does not need to become wet. This is particularly advantageous if one desires to use an absorbing material such as paper as carrier material. Furthermore, no residues of the chemicals used are left on any of the processed or unprocessed surfaces.

BRIEF DESCRIPTION OF THE DRAWINGS

A preferred embodiment of present invention is illustrated below with reference to the accompanying drawings, in which:

FIG. 9a-9b are schematic perspective views of alternative control patterns.

FIG. 10a-10c are schematic sectional views of a web in a plane substantially perpendicular to a main plane.

DESCRIPTION OF EMBODIMENTS

Figure 1:
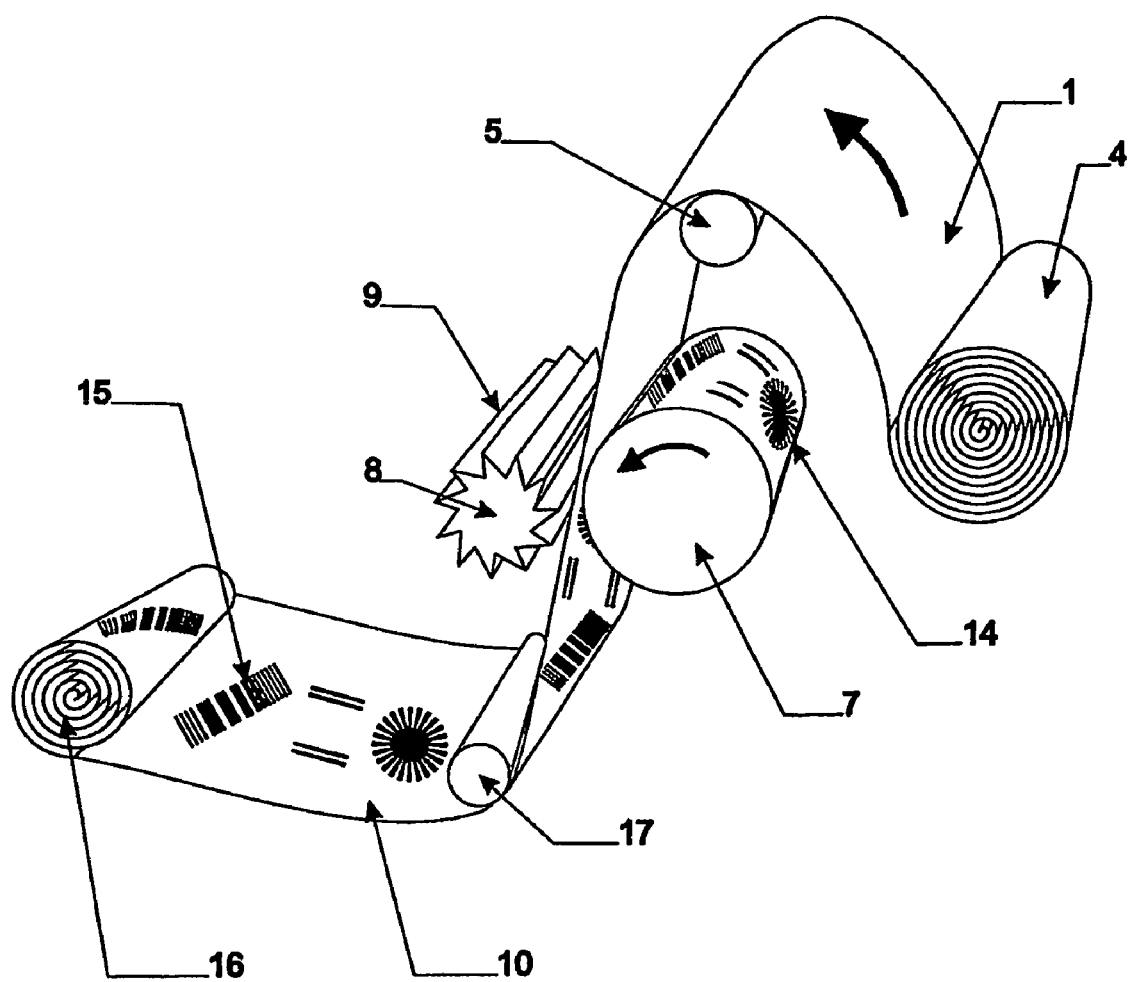
FIG. 1 schematically and in a perspective view illustrates the principle of the invention.
Figure 2:
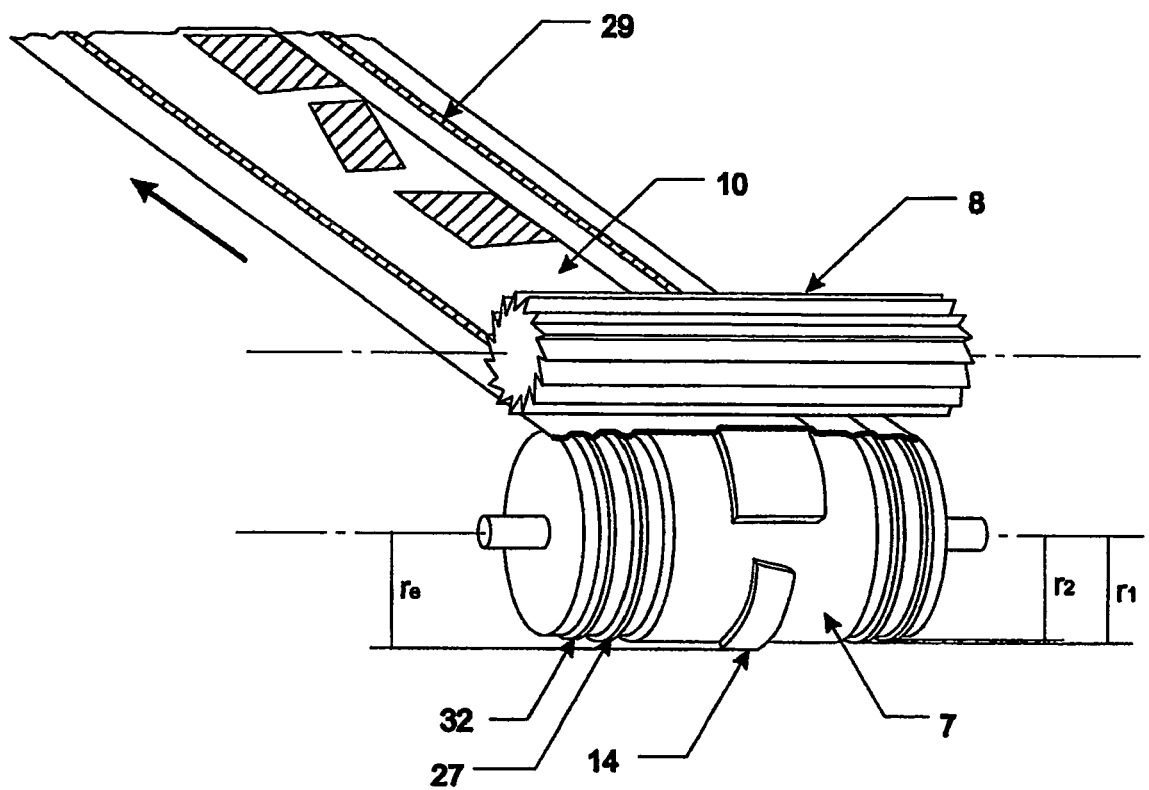
FIG. 2 in a top view, with the web removed upstream the nip for illustration purposes, shows the device of FIG. 1 and formed reference tracks (but not the associated sensor means)
Figure 4:
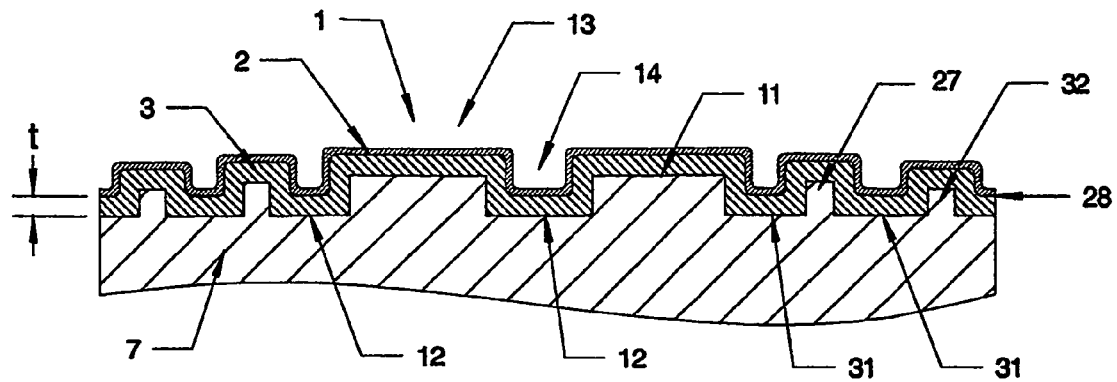
FIG. 4 in an enlarged scale illustrates a part of the envelope surface of the patterned cylinder or cliché roll when the web is entering the nip between said cylinder and the cutter cylinder (not shown), just before initiating of the milling action of the conducting layer of the web.

Referring first to FIGS. 1, 2 and 4 a continuous web 1 consisting of at least one layer 2 of a conducting material, e.g. metal or metal alloy or conducting polymer, and a flexible backing or carrier layer 3 of dielectric material is fed from a supply roll 4, via a support roll 5 to a nip 6. The layer 2 of conducting material is preferably a continuous layer, but it can also be a discontinuous layer consisting of two or more parallel strips oriented in the feeding direction of the web. It is also possible to arrange the layer 2 as discrete areas of conducting material. The backing 3, preferably a plastic (PET) foil or paper, has a more or less consistent thickness t, while the conducting layer 2 may be varying in thickness. The gauges of the different layers are varying, the conducting layer being <1 mm and the backing layer (t) being <1 mm. As will be recognized by a man skilled in the art discrete sheets fed from a supply or storage (not illustrated) may be used instead of said continuous web provided that they are designed like said web.

The web 1 is advanced to and through the nip 6 defined by a cliché roll or patterned cylinder 7 like an embossing cylinder and a milling cutter cylinder 8 having a plurality of milling elements 9 on its cylindrical surface. The term "milling cutter" is meant to include all rotating bodies having an abrading, abrasive or milling envelope surface equipped with teeth, grit or abrasive grains of, for example, sand, diamond particles or similar. The running web is forced against the envelope surface 11 of the patterned cylinder 7, by applying a tensile stress on the running web 1 in a way known by a man skilled in the art, e.g. by means of a support roll 17 arranged to press the web 1 towards the patterned cylinder 7, and into recesses 12 engraved or etched in said surface 11. Thus, the metal layer 2 is shaped into a repeated three-dimensional pattern of ridges 13 (over the remaining original regions of the envelope surface 11) and of valleys 14 (over the recesses 12 processed into the envelope surface 11). When being of a paper layer the backing 3 assumes the same pattern as the metal layer 2. The cutter cylinder 8 acts as a milling or abrading tool and mills or abrades the outer layer, i.e. the metal layer 2, simultaneously or almost simultaneously with said shaping of the web. The patterned cylinder 7 rotates at a periphery velocity equal to the feeding velocity of the web 1, and the cutter cylinder rotates at a much higher periphery velocity. In the milling step electrical components 15 are manufactured on the web 1. The rotation direction of the cutter cylinder is contrary to the rotation direction of the patterned cylinder but this rotation relationship is arbitrary, i.e. said cylinders may rotate in the same direction but with different periphery speeds. After passing through said nip 6 and having been milled or abraded the processed web 10 is wound to a roll 16 of electrical components on a continuous web of dielectrical material (3) via a support roll 17 for further processing. Alternately, a cutting device (not shown) cuts the processed web 10 into sheets.

In one embodiment, the patterned cylinder 7 is formed as a metal plate, which may be made from a magnetic material (e.g. steel) so that it can be magnetically attached to a carrying cylinder. The cliché can be formed by etching, spark machining, abrasive blasting and/or milling.

In an alternative embodiment, the cliché may have a surface layer of a formable material, such as an un-cured polymer material, whereby forming comprises exposing the formable material to e.g. UV light, for curing exposed portions, after which uncured portions are removed such as to create a relief pattern. Such a cliché may also have a base of steel, so that it can be magnetically attached to the carrying cylinder. Thus, the cliché blank may comprise a surface layer of photosensitive polymer material, but also non-polymeric materials such as ceramic materials and metals, or any other material allowing similar forming. Polymer clichés are less costly to produce, and thereby particularly suitable for shorter series.

Figure 3:
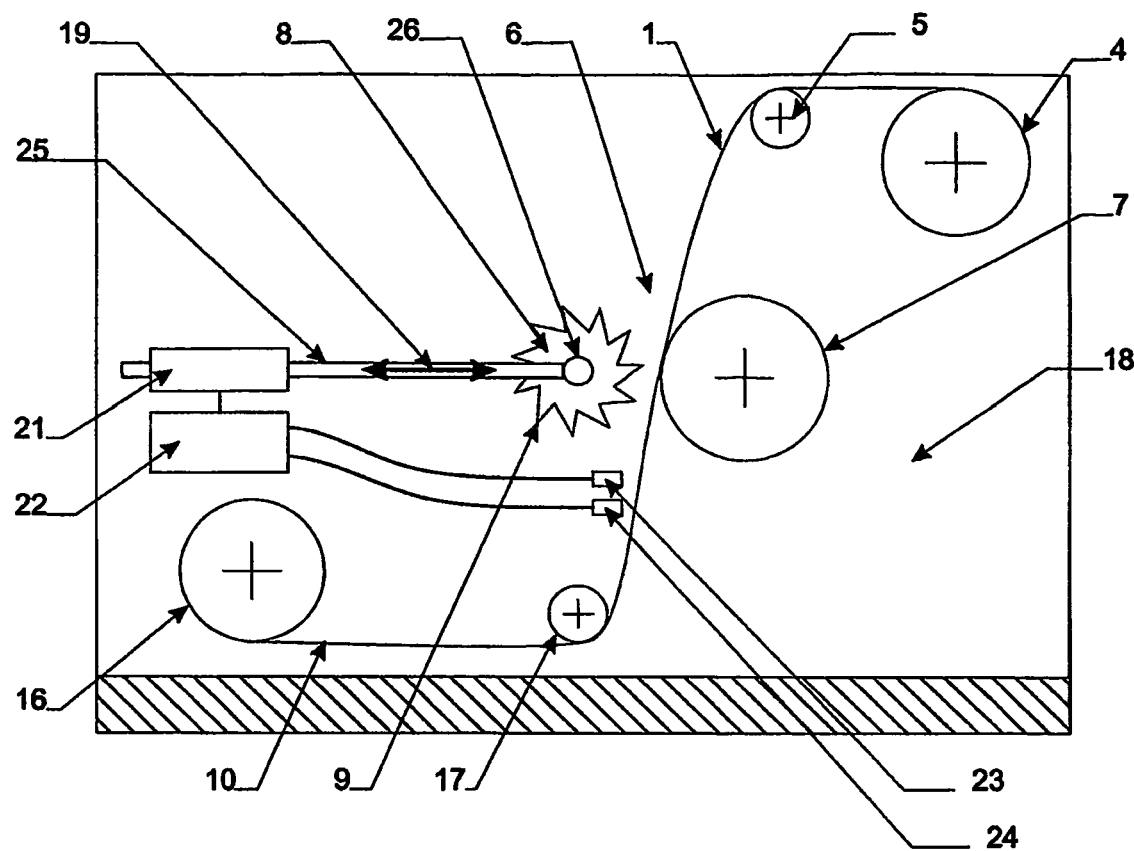
FIG. 3 in a side view diagrammatically shows a presently preferred embodiment of the invention.

Preferably, the rolls 4, 5, 7, 17 and 16 are journalled in fixed bearings on a stand or baseplate 18, cf FIG. 3, while the milling cutter 8 is movable arranged in a direction to or from the patterned cylinder 7 in order to widen or shorten said nip 6, illustrated by a double arrow 19. As an alternative the milling cutter 8 is stationary and, thus, the patterned cylinder 7 is movable. Additionally, the second support roll 17 may be movable arranged in order to increase or decrease the web tension rapidly. This is accomplished by means of one or more motors 21, e.g. an electrical linear motor. The motor 21 is via an electrical circuit 22 connected to a number of sensor means 23, 24, e.g. photo-electric tubes, as will be described more in detail later in this description. Said motor 21 is securely fixed on the stand 18 and drives in a linear way a projecting rod 25, a free end of which carries a shaft 26 supporting the cutting cylinder 8. When the diameter of the cutting cylinder is smaller than that of the patterned cylinder it is preferred to adjust the position of the cutting cylinder instead of the position of the patterned cylinder, but this is arbitrary. However, the diameter of the cutting cylinder may be equal to the diameter of the patterned cylinder.

When material with a thickness of a few micrometers is to be cut, the distance between the cutting tool and the material support is critical. The distance between the tools determines the cutting depth and thereby the quality of the product. To keep the cutting depth constant it is essential to measure and control the distance between the tools. The measurement of the distance is very complex since the tools are moving and have a complex structure.

Figure 5:
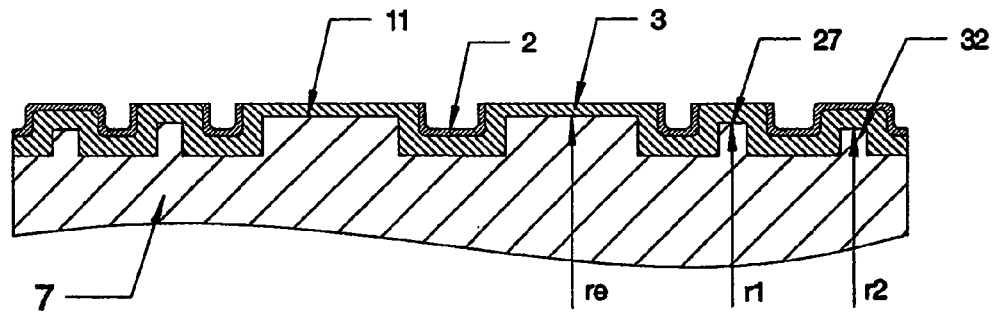
FIG. 5 in a view identical to that of FIG. 4 specifically shows the web after relevant parts of the conducting layer accurately have been removed and the backing layer or carrier substrate is substantially non-affected.
Figure 6:
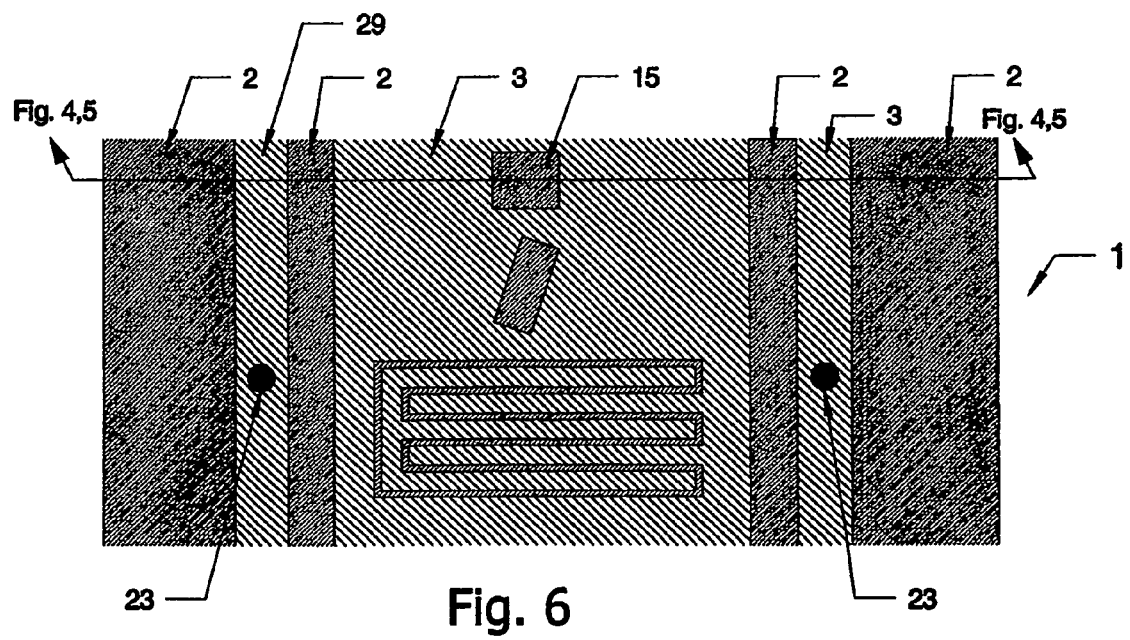
FIG. 6 in a top view schematically illustrates the processed web of FIG. 5 and the metalless tracks over the first reference rings, and associated sensor means.

Referring now to FIGS. 2, 5 and 6 a way of precisely adjusting the milling of the web 1 is illustrated. Outside the patterned regions of the patterned cylinder 7 a first annular projection or ring 27, acting as a reference ring, is integrated in the envelope surface 11, preferably at both of the ends of said cylinder and concentric to said surface. The annular projection 27 is etched, embossed or engraved in the envelope surface. The radius of the annular projection, $r_1$, is the same as or a few μm smaller than the radius of the envelope surface, $r_e$, that is $r_e \geq r_1$. However, it is envisaged that $r_1$, in some special cases, could be larger than $r_e$ that is $r_1 \geq r_e$. The layer 2 of metal or conducting material is running on the patterned cylinder 7 facing the cutter cylinder 8. In the milling operation by the cutter cylinder said layer 2 in contact with the non-machined regions of the envelope surface 11, i.e. the ridges 13, are removed leaving the backing layer 3 exposed in said regions, but not or substantially not abraded by the cutter cylinder. When the cutter cylinder reaches the interface, or just has passed it, the part of the metal layer in contact with the top portion of said first annular projection 27 will be removed as well, creating a metalless track 29 in the processed web 10 parallel to its sides, cf FIG. 6. The parts of the metal layer positioned in the recesses and in the grooves 31 defining said annular projection(-s) are maintained, completely or partly, depending on their configuration.

Said track(-s) 29 or absence of track(-s), resp., are detected by first sensor means 23 positioned downstream said nip 6 and in a position over the processed web 10 corresponding to the position of the annular projection(-s) 27 at the sides of the running, thus processed web 10. The first sensor means 23 sends signals to said circuit 22 commanding said motor 21 to extend or retract the cutter cylinder 8 to adjust or retain the size of the nip. If no track 29 is detected by the sensor means the nip 6 will be shortened or diminished.

Figure 7:
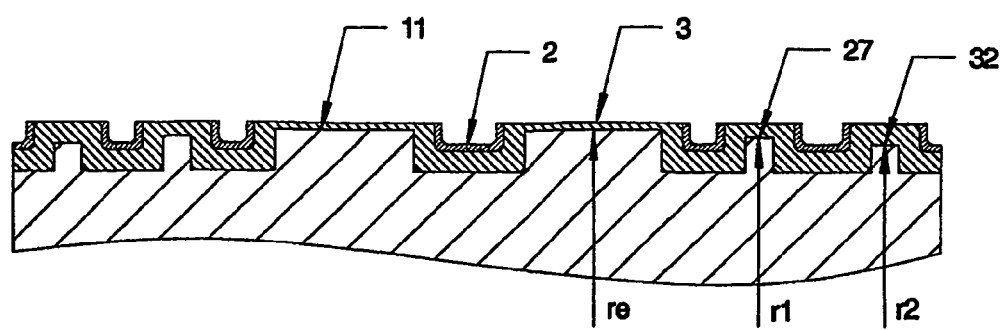
FIG. 7 in a view identical to that of FIGS. 4 and 5 specifically shows the web after having passed a too small nip and, thus, a thickness of the backing layer has been removed too.

As stated above the track(-s) 29 indicates that the nip is too wide or accurate. However, it does not indicate that the size of the nip is too small, i.e. that the cutter cylinder 8 also mills the backing layer 3. This is perhaps allowable in some cases but as a rule only in a small extent. In order to get an indication when and if too much of the exposed backing layer is removed, i.e. that the size of the nip 6 is too small, a second annular projection or ring 32, acting as a reference ring, is integrated in the envelope surface 11 of the patterned cylinder 7, preferably at both ends of the cylinder, concentric to the first annular projection 27 (and the envelope surface 11) and at a distance to the first projection. Preferably, this second annular projection 32 is provided between the first annular projection 27 and the end of the cylinder, c.f. FIG. 7. The second annular projection 32 is etched, embossed or engraved in the envelope surface in the same way as the first annular projection 27 is but has a radius $r_2$ which is smaller than that of the first one, $r_1$ ($r_1 > r_2$). However, it is envisaged that $r_2$, in some special cases, could be larger than said radius of the envelope surface, $r_e$, that is $r_2 > r_e$. The thickness of the backing layer t is larger than the difference of said radii, i.e. $t > r_1 - r_2$.

Figure 8:
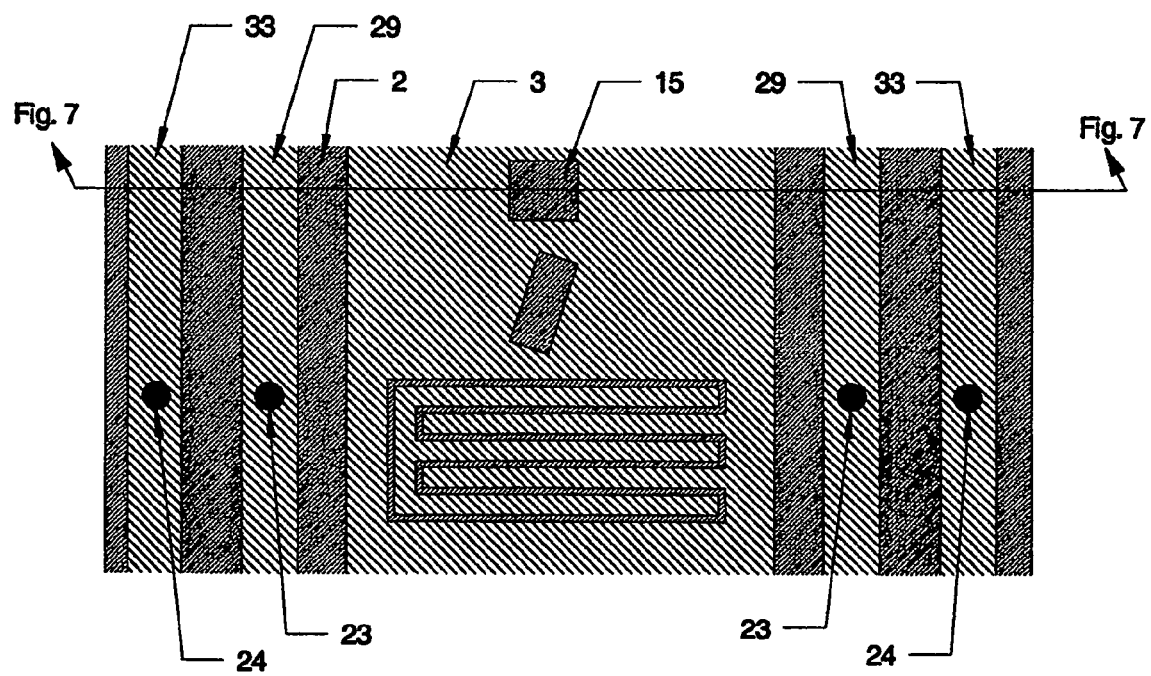
FIG. 8 in a view identical to that of FIG. 6 schematically illustrates the processed web of FIG. 7 and the metalless tracks over the first as well as the second reference rings and associated sensor means.

In the milling operation, and after having removed said ridges 13 and the part of the metal layer 2 in contact with the top portion of the first annular projection 27, the cutter cylinder 8 possibly starts milling the backing layer 3. When, and if, the thickness of the layer has decreased to a specific thickness the part of the metal layer 2 in contact with the top portion of said second annular projection 32 will be removed as well creating a second metalless track 33 in the web, parallel to said first track 29 and the sides of the processed web 10, see FIGS. 7 and 8. The presence of this second track 33 is detected by second sensor means 24 positioned downstream said nip 6 and in a position over the processed web 10 corresponding to the position of the second annular projection(-s) 32 at the sides of the running, thus processed web 10. Then, the second sensor means 24 sends associated signals to said circuit 22 commanding said motor 21 to retract the cutter cylinder 8 to widen said nip 6.

Above, two (pairs of) annular projections, having a radius $r_1$ and $r_2$, resp., have been presented. It is of course possible, and in some circumstances needed, to provide more annular projections, e.g. one with a radius equal to or a few μm larger than the radius of the envelope surface, $r_e$, minus the total thickness of the web 1.

Further, the web has been presented as consisting of one or more layers of conducting material and one or more layers of dielectric material. It will however be recognized by a person skilled in the art that present invention also can be applied to webs without any conducting layer or in which all layers are conductible. Likewise, said layers of the web may all be made of non-conducting material having different properties. In order to use said reference ring technology the involved layers have to exhibit different surface reflectances or transparency.

Above the sensor means has been presented as photoelectric tube or similar means. It can also be provided as a transmitter arranged under the running processed web cooperating with a receiver arranged over the web, and vice versa. Besides, the sensor means can also be constructed as a unit comprising a pair of separated sliding contacts measuring the resistance of the track.

In the following, five alternative methods of measuring and controlling the distance between the patterned cylinder 7 and the cutting cylinder 8 will be outlined.

A first method includes keeping those machine components whose temperature induced expansion or shrinking may affect the distance between the cylinders 7, 8 at a constant, and possibly the same, temperature. Hence one or more parts of the machine may be provided with per se known cooling and/or heating means.

A second method comprises providing a raster-like patterned area (also known as screen pattern or raster pattern) on the web, e.g. as is diagrammatically illustrated in FIG. 9a. The patterned area may be provided by arranging a set of ridges 41a, 41b substantially as shown in FIG. 9a, such that they form a two-dimensional pattern on the web. The ridges may have an arbitrary profile, as is schematically illustrated by the profiles 42a, 42b in FIG. 9a. The ridges may be arranged such that the distance between the cylinders 7, 8 and the milling depth resulting thereof is dependent on the density of the patterned area. Thus, the patterned area may be evaluated in terms of degree of coverage (density), analogous to what is known from traditional printing. More particularly, the size of the areas 43a, 43b, 43c, 43d between the ridges, which are of a different material than the cut away portions at the ridges 41a, 41b, will be dependent on the depth of the cut and thereby to the distance between the cylinders 7, 8.

As another option, indicated in FIG. 9b, the patterned area may be provided in the form of two or more parallel ridges, which when subjected to the cutting action will result in two or more parallel grooves 48a, 48b in which the conducting material has been removed with an interjacent strip 49 of non-removed conducting material. Depending on the cutting depth, the with of the grooves 48a, 48b and the strip 49 will vary, thereby giving rise to a measurable variation in the resistance or enabling galvanic measurement.

Alternatively, the resistance of the pattern may be measured galvanically or by measuring eddy currents. Basically, the deeper the pattern, the higher the resistance and the lower the density.

Such patterned control areas may be provided as e.g. small dots or meander-like patterns, at several places in the overall pattern, e.g. in order to control a plurality of cylinder arrangements.

A third method comprises use of machine vision systems, where a camera captures images of the milled web and compares these with a reference image. The vision system may also be used in evaluating the patterned area as described with reference to FIG. 9a.

A fourth method comprises measuring the resistance or capacitance between the cylinders 7, 8.

A fifth method comprises measuring induced currents in the cylinders 7, 8. Such induced currents may arise since the patterned cylinder 7 comprises magnets for holding the cliché. Since the cylinders rotate relative each other, currents are induced in the cutter cylinder 8, which currents are dependent on i.e. the distance between the rolls.

It is realized that all of the above described measurement techniques may be used to provide feedback for adjusting, automatically or manually, the cylinders 7, 8.

In the following, different aspects of the patterned cylinder 7 will be discussed.

It is recognized that use of a patterned cylinder may in general be suitable for producing endless patterns, i.e. patterns which repeat themselves with a period being equal to the circumference of the cylinder. However, when providing the patterned cylinders as discussed above, it is common to prepare a cliché sheet through etching or other known techniques. The cliché sheet is mounted on a roll to provide the patterned cylinder 7. Hence, there is a problem in that there will be a joint or gap where the ends of the cliché sheet attached to the roll meet.

A first alternative for addressing this problem is to adapt the pattern such that a minimum amount of passages are found where the joint is to be, whereby material is added chemically or through soldering/welding after the cliché sheet has been mounted on the roll, thereby building up the pattern in the area of the joint after the cliché has been mounted on the roll.

A second alternative is to cut the cliché sheet to the exact right length, and such that the cut has the right profile, bearing in mind that the outer part of the cliché, when mounted on the roll, will have a slightly larger circumference than the inner part of the cliché, closest to the surface of the roll. Hence, the cutting profile of the cliché sheet will have to be adapted such that its patterned surface is slightly longer than its non-patterned surface.

A third alternative is to pattern the surface of the cylinder, e.g. through milling, etching, embossing or similar methods. Alternatively, the surface of a cylinder shell may be patterned using any of these methods.

A fourth alternative is to use separate rings that are arranged adjacent to each other such as to have a common central line. This method is particularly suited for creating endless lines, and may be combined with any of the methods described above for that purpose.

Furthermore, methods of creating vias, i.e. holes through the entire web are provided.

According to a first method, a ridge on the patterned cylinder 7 is made higher than the remainder of the pattern, such that the milling action on the web causes both or all layers of the web to become pierced.

According to a second method, the web may be subjected to more than one milling action, whereby each subsequent milling action is arranged to cut to a larger depth than the foregoing one. This may be achieved either by allowing a portion of the web to pass a cutting cylinder multiple times or by arranging multiple cutting cylinders/patterned cylinders after each other.

Optionally, deeper recesses, such as vias or through holes may be provided in a first cutting step, whereby more shallow recesses are produced subsequently.

The via may be filled with a functional material, such as a conducting material, e.g. a conducting polymer, a metal or carbon, so as to create an electrical connection through the web. The conducting material may be provided by means of a printing operation.

It is realized that this technique may be used for creating vias through the entire thickness of the web or through one or more layers thereupon.

Preferably, when multiple layers are to be aligned with each other, the system is register-controlled.

Figure 11:
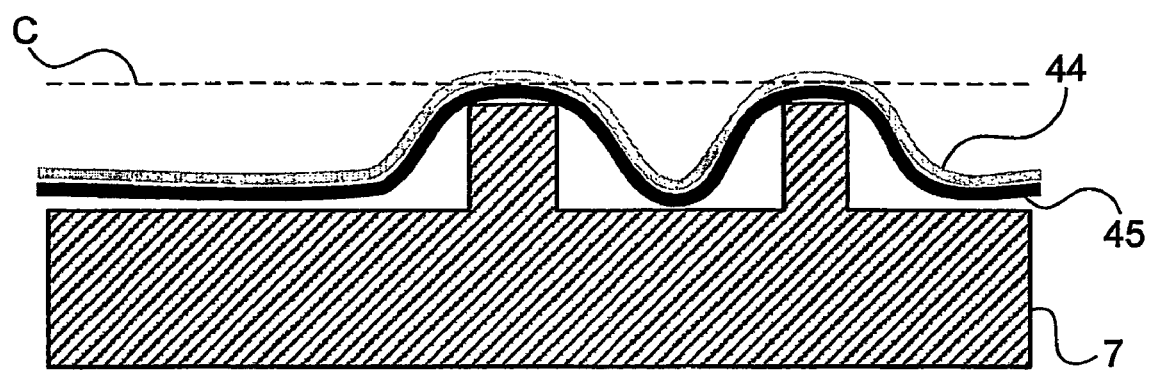
FIG. 11 is a schematic close-up sectional view of a web on a patterned cylinder, wherein surface portions of an upper layer have been removed.

FIGS. 10a-10c are schematic sectional views in a plane substantially perpendicular to a main plane of a web comprising a first layer 44 and a second layer 45, showing a profile of border portions that are to form the border between unremoved parts of the first, upper layer 44 and the exposed portion of the second, lower layer 45. In FIGS. 10a-10c, the cutting direction is indicated by reference numeral 'M'. Hence, the respective first border portion 46a, 46b, 46c is that border portion which is created first. The profiles described with reference to FIGS. 10a, 10b are a consequence of the operation of the system described herein, since the web is bent or curved around the ridges (relief pattern) of the patterned roll 7, while the cutting operation takes place along a substantially straight line C (FIG. 11), which cuts off the parts of the web that are elevated by the ridges.

FIG. 10a shows a simplified view of a profile that may be achieved through the present invention. It is noted that since the web is flexible and thereby is bent or curved (FIG. 11) over the protruding portions of the cliché/patterned cylinder 7, the first, upper layer 44 will be tapering in thickness throughout the respective border portion 46a, 47a, towards the exposed portion of the second, lower layer 45. In one embodiment (not shown), the second border portion 47a presents a steeper inclination than the first border portion 46a.

FIG. 10b shows a more detailed (though exaggerated) view of the profile that may be achieved by the present invention. In FIG. 10b, the first and second border portions 46b, 47b are slightly curved due to the curvature of the flexible web in connection with its forming. Also, in FIG. 10b, the second border portion 47b is generally steeper than the first border portion 46b.

Hence, as shown in FIGS. 10a and 10b, at the border portions 46a, 47a; 46b, 47b, as seen in a plane that is substantially perpendicular to the main plane of the laminated sheet, the thickness of the first layer 44 is continuously tapering from a point where the first layer 44 is substantially unremoved to a point where the second layer 45 is exposed.

This type of border portions may be achieved by the above described method on any type of (preferably very thin) laminated sheet material, and in particular on laminated sheets comprising at least one layer of conducting material laminated on a flexible backing layer of dielectrical material. It is noted that the described type of border profile may be achieved by techniques such as milling, grinding or laser cutting.

For reference purposes, FIG. 10c shows a profile that would typically be obtained through prior art techniques involving etching.

The system and method described above is suitable for incorporation in a printing system for providing a printed pattern on a surface of a sheet of material, so as to constitute an on-line system together with e.g. a printing press, whereby the sheet of material is passed through an arbitrary number of subsequent printing and milling steps.

The printed pattern, as well as one or more of the laminated layers provided may be decorative layers and/or functional layers, as defined above.

Compared with prior art etching techniques, the system and method described herein are capable of operating at feed rates in the order of general printing machinery, whereas etching techniques normally operate at lower feed rates.

Also, this creates the opportunity of providing printed or patterned organic electronics, solar cells, displays, heaters, antennae etc. It is also realized that one or more steps of printing may be performed with a view to applying a conductive material, such as a conductive polymer to the sheet material. Naturally, it is also possible to provide ornamental patterns to the sheet of material.

Finally, it is realized that the above described system and methods are not limited to two-layer webs, but are suitable for webs having any number of layers, such as functional layers, insulating layers, carrier layers and decorative layers, and where one or more layers are to be at least partially removed so as to expose parts or all of underlying layers. In particular, the invention may be used for webs or sheets having several functional layers as well as several dielectric layers.

It is also possible to arrange several cutting steps sequentially, Either to operate on the same face of the web or sheet, or to operate on different faces of the web or sheet.

The invention claimed is:

1. A method for manufacturing electrical components on at least one of a continuous web and discrete sheets, the method comprising:
   feeding said at least one of continuous web and discrete sheets from at least one of a supply roll of continuous web and a supply of discrete sheets to a nip between a patterned cylinder and a milling cutter cylinder, the at least one of continuous web and discrete sheets including at least two layers, the at least two layers including a conducting layer of conducting material, and a flexible backing layer of a dielectric material, said conducting layer being laminated on the flexible backing layer;
   patterning, by the patterned cylinder, said at least one of continuous web and discrete sheets by shaping the conducting layer into a repeated pattern of conducting material having ridges and valleys; and
   milling, by the milling cutter cylinder, said at least one of continuous web and discrete sheets by removing conducting material from the shaped conducting layer,
   wherein the patterning and milling steps are performed at the same time when the at least one of continuous web and discrete sheets pass through the nip.

2. A method according to claim 1, wherein all of the conducting material in said ridges of the patterned conducting layer is removed.

3. A method according to claim 1, wherein the patterned cylinder is rotated with a periphery velocity equal to the feeding velocity of said continuous web and wherein the milling cutter cylinder is rotated in a direction contrary to that of the patterned cylinder.

4. A method according to claim 1, wherein the patterned cylinder is rotated with a periphery velocity equal to the feeding velocity of said continuous web and wherein the milling cutter cylinder is rotated in the same direction as that of the patterned cylinder and with a periphery velocity substantially faster than that of the patterned cylinder.

5. A method according to claim 1, wherein the conducting and flexible backing layers are shaped into said repeated pattern.

6. A method according to claim 5, wherein at least one portion of the flexible backing layer is removed as well.

7. A method according to claim 1, wherein said flexible backing layer, is wound to a component roll for further processing.

8. A method according to claim 1, wherein the flexible backing layer having said manufactured electrical components is cut into sheets.

9. A method according to claim 1,
wherein the size of said nip is accurately controlled by use of at least a first annular projection integrated in an envelope surface of said patterned cylinder, at both of its ends and concentric to said surface, the first annular projection having a radius n, and said envelope surface having a radius re,
wherein, in said milling step, the conducting layer in contact with portions of the first annular projection is removed simultaneously with the removal of the conducting layer from said ridges or at an infinitesimal diminution of said nip providing a track without conducting material in the continuous web at both sides of the continuous web, at least one of said tracks and absence of tracks, is detected by a first sensor means sending associated signals to an adjusting device which, as a response to said signals, adjusts the dimension of said nip.

10. A method according to claim 9, wherein the adjusting device, when absence of tracks is detected, diminishes said nip.

11. A method according to claim 9,
wherein a second annular projection is integrated in the envelope surface of said patterned cylinder, at both of its ends and concentric to said surface, and at a distance to said first annular projection, said second annular projection having a radius r2, r1>r2, and r1−r2<the thickness t of said flexible backing layer,
wherein, in said milling step, the conducting layer in contact with top portions of the second annular projection are removed after the removal of the conducting layer from said ridges providing a track without conducting material in the processed continuous web at both sides of the continuous web, said track without conducting material are detected by a second sensor device sending associated signals to said adjusting, if said tracks are present in the processed continuous web, to widen said nip.

12. A method according to claim 1, wherein the size of said nip is accurately controlled by way of
providing within a predetermined area of at least one of said continuous web and discrete sheets, at least two parallel grooves in which the conducting material is removed, said grooves being separated by a strip of said conducting layer,
sensing a resistance of said strip, and sending associated signals to an adjusting device which, as a response to said signals, adjusts the dimension of said nip.

13. A method according to claim 1, wherein the size of said nip is accurately controlled by way of
providing within a predetermined area of at least one of said continuous web and discrete sheets, a raster pattern of said ridges and valleys;
sensing said raster pattern, and
sending associated signals to an adjusting device which, as a response to said signals, adjusts the dimension of said nip.

14. A method as claimed in claim 13, wherein said sensing is selected from a group consisting of:
optical sensing for determining a density of a raster pattern, and
resistive sensing for determining a resistance of the raster pattern based on at least one of galvanic and eddy current measurement.

15. A method for manufacturing electrical components on at least one of a continuous web and discrete sheets, the method comprising:
feeding said at least one of continuous web and discrete sheets from at least one of a supply roll of at least one of continuous web and a supply of discrete sheets to a nip between a patterned cylinder and a milling cutter cylinder, the at least one of continuous web and discrete sheets including at least two layers, the at least two layers including a conducting layer of conducting material, and a flexible backing layer of a dielectric material, said conducting layer being laminated on the flexible backing layer,
patterning, by the patterned cylinder, said at least one continuous web and discrete sheets by shaping the flexible backing layer into a repeated pattern of dielectric material having ridges and valleys; and
milling, by the milling cutter cylinder, said at least one of continuous web and discrete sheets by removing dielectric material from the shaped flexible backing layer,
wherein the patterning and milling steps are performed at the same time when the at least one of continuous web and discrete sheets pass through the nip.

16. A method as claimed in claim 15, further comprising:
replacing at least some of said removed dielectric material with conducting material, such that a via is provided through the dielectric material to the conducting material.

17. A method as claimed in claim 15, wherein said replacing is achieved through a printing technique.

* * * * *